United States Patent [19]
Hotchkiss

[11] 4,034,352
[45] July 5, 1977

[54] PHASE CONTROL OF CLOCK AND SYNC PULSER

[75] Inventor: LaVerne C. Hotchkiss, Greensboro, N.C.

[73] Assignee: The United States of America as represented by the Secretary of the Army, Washington, D.C.

[22] Filed: Feb. 20, 1976

[21] Appl. No.: 659,885

[52] U.S. Cl. .............................................. 364/200
[51] Int. Cl.² ......................................... G06F 1/00
[58] Field of Search ............... 340/172.5; 307/208, 307/269; 328/63, 155; 178/69.5 R, 69.5 DC, 69.5 G

[56] References Cited
UNITED STATES PATENTS

| | | | |
|---|---|---|---|
| 3,418,637 | 12/1968 | Humphrey | 340/172.5 |
| 3,980,820 | 9/1976 | Niemi et al. | 328/63 X |

*Primary Examiner*—Raulfe B. Zache
*Attorney, Agent, or Firm*—William G. Gapcynski; Lawrence A. Neureither; Robert C. Sims

[57] ABSTRACT

Alignment of sync pulses is provided by an automatic selection of a proper path, which is delayed or not delayed, of the sync pulses. The selection is made on the basis of error criteria. A comparator compares the sync pulses and sends an error signal to a sync pulse adjuster which makes the determination of the path to which a sync pulse is directed.

3 Claims, 7 Drawing Figures

PHASE CONTROL OF CLOCK AND SYNC PULSER

DESCRIPTION OF THE PREFERRED EMBODIMENT

Figure 1:
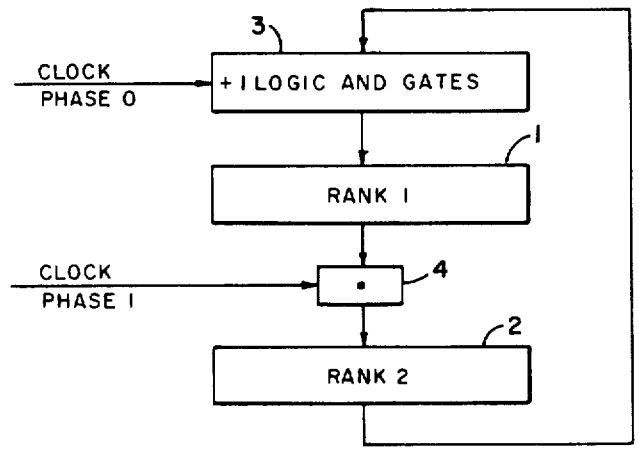
FIG. 1 is a block diagram of a simple dual-rank register counter.

The block diagram of a simple non-presettable dual-rank register clock counter is shown in FIG. 1. This clock counter gets its name from the two ranks of flip-flops which are in its main components. The counter operates in the following fashion. Consider the counter to be reset at all 0's. The +1 logic 3 will then enable the least significant bit (LSB) flip-flop in Rank 1. When clock phase O occurs, the count 00 . . . 001 will then be loaded into Rank 1. Rank 1 will continue to hold this count and when clock phase 1 occurs, this count will be loaded into Rank 2 by AND gate 4. At this point the +1 logic 3 will enable the clearing of the LSB and the setting of the 2' flip-flop (not shown). When clock phase O occurs, the count of 00 . . . 010 will be loaded into rank 1.

Figure 2:
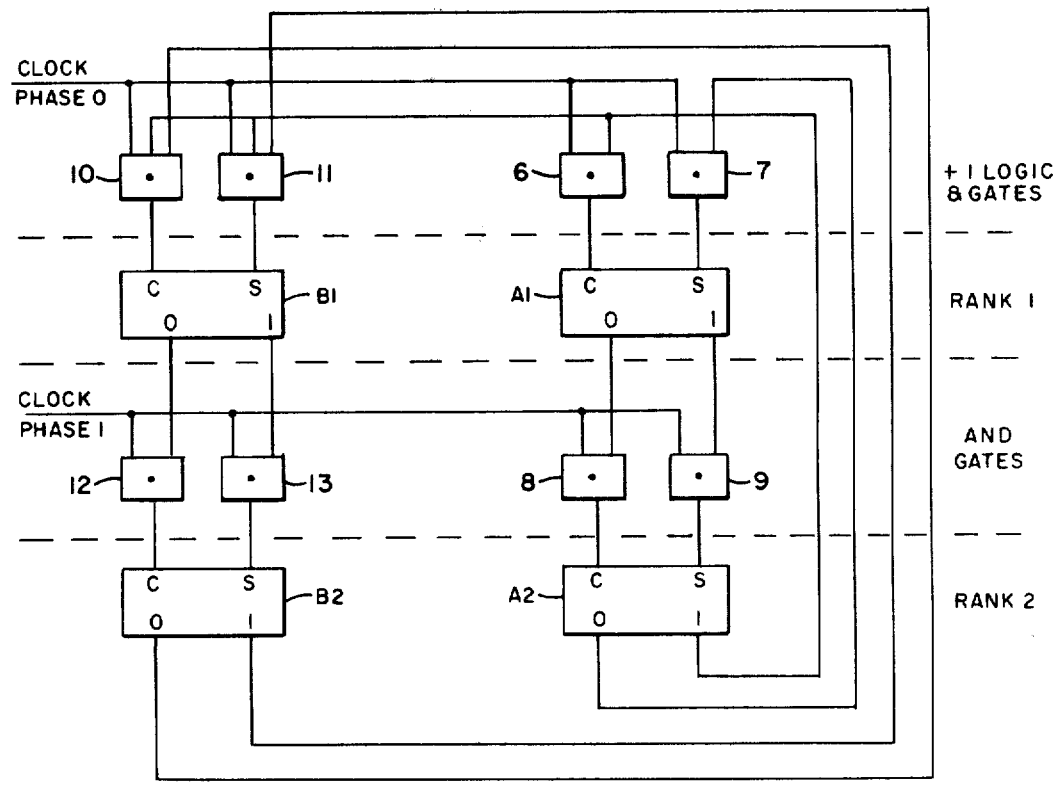
FIG. 2 is a block diagram of a two-stage dual-rank register counter.

Consider a simple 2-rank dual-rank register counter as shown in FIG. 2. In this counter flip-flops A1 and A2 with their associated AND gates 6-9 make up the LSB stage. The SET gate for A1 is enabled by A2-0 and the CLEAR gate for A1 by A2-1. Thus the A stage will alternate between 1 and 0 for each clock phase pair. That is, after the first occurrence of clock phase 0, A1 A2 will be set and with the occurrence of clock phase 1, A2 will be set. The next occurrences of clock phases 0 and 1 will clear both A1 and A2.

The SET and CLEAR gates 10 and 11 for flip-flop B1 are enabled by the appropriate signals from flip-flop B2 and by A2-1. Thus B1 cannot change state unless flip-flop A2 is in the set state. Since this is ture only for every other clock phase pair, B1 can only change state every other clock phase pair. AND gates 12 and 13 enable flip-flop B2. Thus the B stage is changing state at only half the rate of the A stage and the counter is thus dividing by four.

If this counter were expanded, each suceeding stage would need one more input function involved in its SET and CLEAR gates. That is, flip-flop $n$ cannot change state unless $n-1, n-2 \ldots 1$ stages are all in the 1 state.

Figure 3:
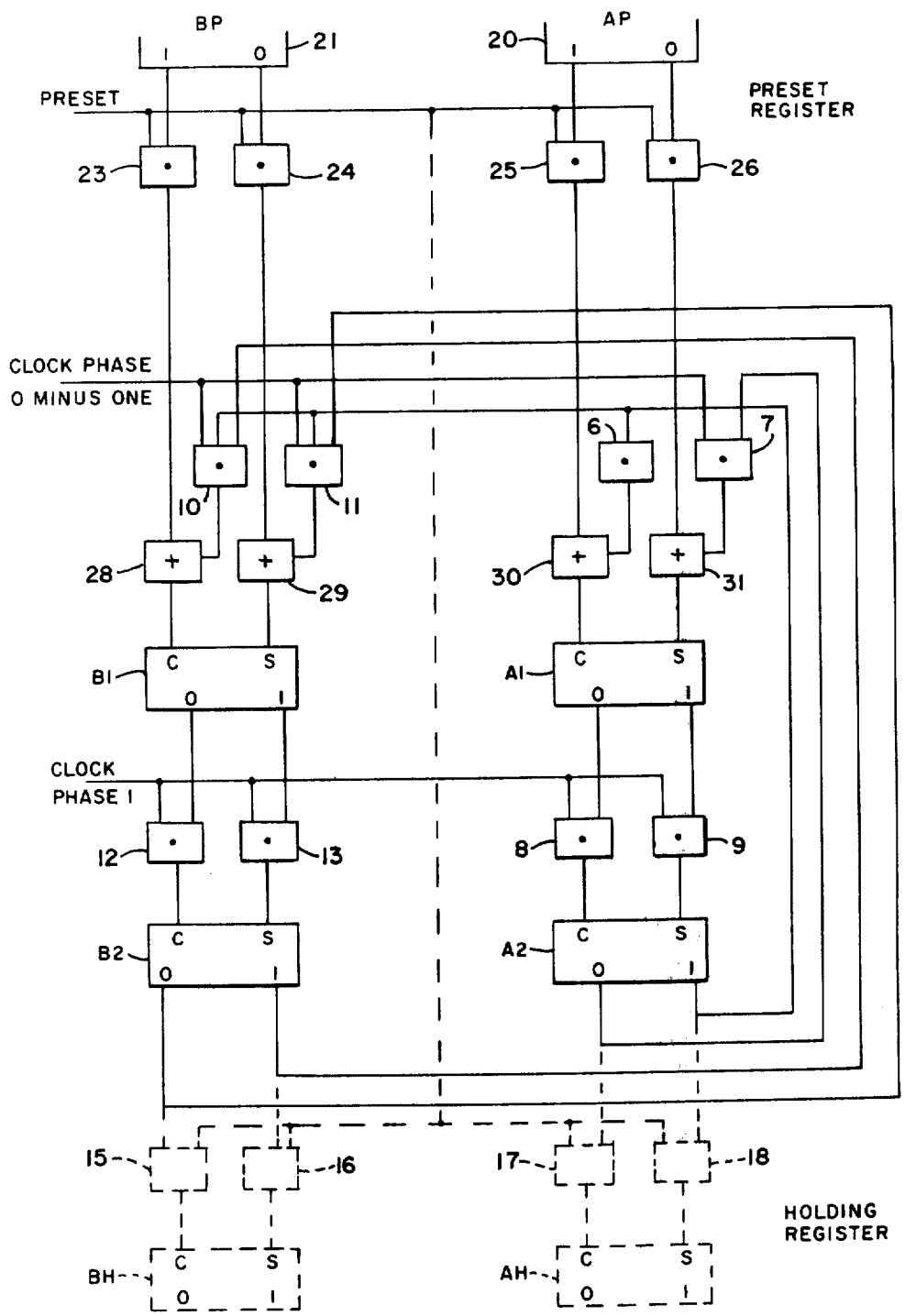
FIG. 3 is a block diagram in greater detail of a dual-rank register counter.

Now let us suppose that there is a requirement to preset out counter. In the most general case the number to which we wish to preset should be variable. We can accomplish this by storing the preset value in a register. The most straightforward way of presetting a dual-rank register counter is to inhibit one of the clock phase 0 pulses, and load the contents of the preset register into the first rank in place of the contents of rank 2 plus one as shown in FIG. 3. Note that the CLOCK PHASE 0 signal has now been changed to CLOCK PHASE 0 MINUS ONE. That is, the PRESET pulse is coming at the same time as, and replacing, a single pulse of the CLOCK PHASE 0 signal. Preset register contains flip-flops 20 and 21 which are connected to the clock by way of AND gates 23-26 and OR gates 28-31. This presetting function could be used on a cyclic basis or could be used only at start-up time. If a cyclic presetting function is desired, another feature may be added to help diagnose problems in the circuit or, to put it another way, determine if the clock is operating properly. This feature is a snapshot or holding register. If the presetting is cyclic, and if the clock is operating properly, the count already contained in the clock is known. Thus a snapshot of the clock at preset time will indicate whether or not the clock has counted properly since the last preset pulse. Since the presetting is occurring in Rank 1 at the desired time, and thus Rank 1 might be changed state, the snapshot must be taken of Rank 2. This is shown in dashed lines in FIG. 3 by AND gates 15-18 and flip-flops AH and BH.

Figure 4:
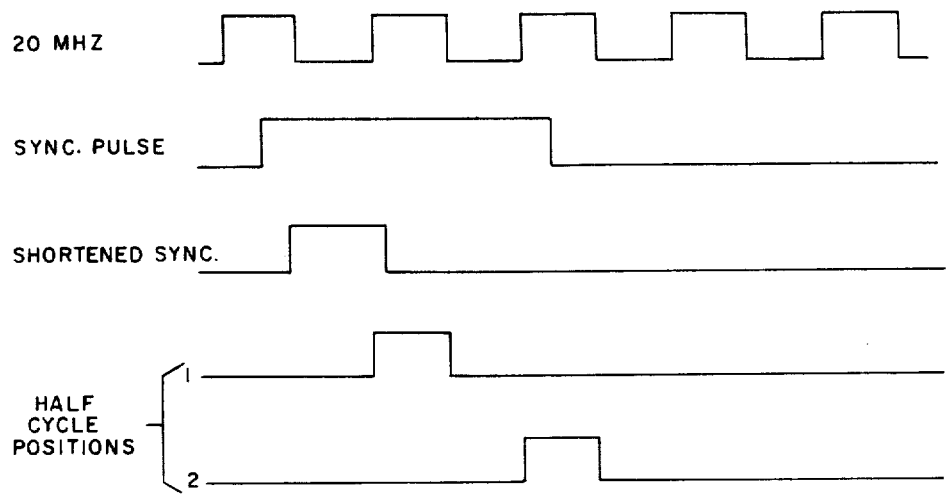
FIG. 4 is a real time pulse diagram.

The clock circuits count a 20 MHz signal received from a timing generator. These clock circuits have natural periods of 104 ms and 52 ms. FIG. 4 shows that the clocks are synchronized to a known relationship relative to the Timing Generator through the use of Real Time Pulses from the Timing Generator. The leading edge of the Real Time Pulse is used to develop a 25 or 35 nanosecond pulse (approximately). This pulse is then synchronized to a 20 MHz clock signal and a single half-cycle of the 20 MHz is then used to load the contents of a Preset Register 34 (FIG. 5) into the clock circuit instead of the normal counting number. The problem arises in the relationship between the Real Time Pulses (or the pulses derived therefrom) and the 20 MHz signal. It is possible for the alignment of these signals to be such that the single half-cycle of 20 MHz is not always the same one relative to the start of the Real Time Pulse as shown in FIG. 4.

In the worst possible condition, even with extremely low jitter, it is possible for every other cycle of the clock to be first 50 nanoseconds short then 50 nanoseconds long.

The present disclosure provides an automatic selection of the proper path — delay or no delay — of the sync pulses. The selection will be made on the basis of an error criteria — which occurs when the undesirable condition exists.

Criteria to be used to determine when an error has occurred in the clock is based on:

1. The basic input signal is at 20 MHz.
2. The synchronization (PRESET) pulses have a 200 nanosecond granularity in position.

This means that the 2 LBS's of the clock should both be in the 1 state at the time a PRESET pulse is generated. This will not, of course, detect any errors occurring in the higher order bits, but any errors in those bits could not be due to the synchronization problem anyway so they are ignored for the purposes of the sync circuit.

Figure 5:
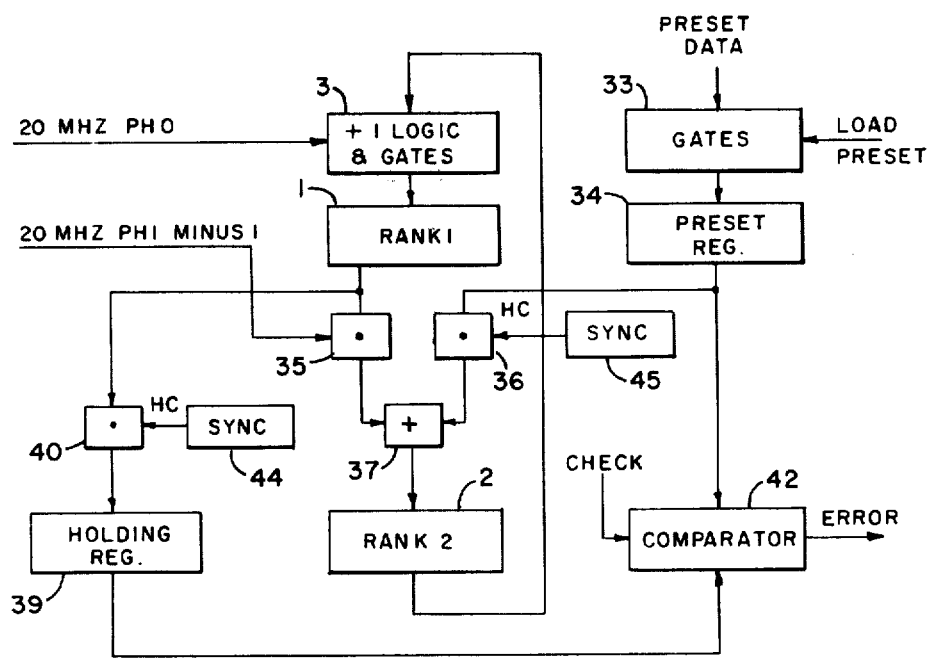
FIG. 5 is a block diagram of the MDC clock.
Figure 6:
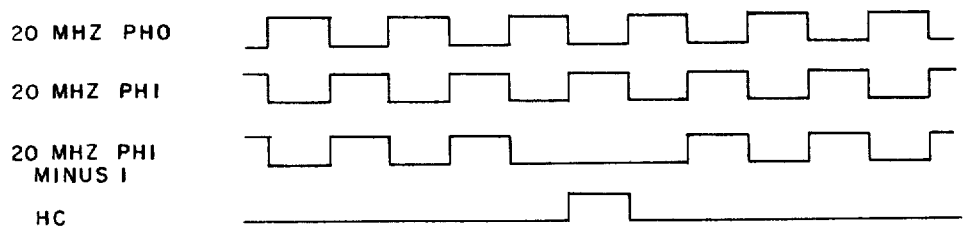
FIG. 6 is a pulse digram showing the relationships of components of FIG. 5.

The Exercise Control Unit Clock of FIGS. 5 and 6 is a slightly more sophisticated version of a presettable dual-rank register counter. This comes about because the cycle length of this clock is constant, and indeed is equal to the natural period of the clock. That is, the clock counts in normal binary sequence all the way up to all 1's , and the next count is all 0's. A clock of this sort will allow hardware checking of all counting bits instead of hardware checking of LSB's and software checking of the rest. This is accomplished by changing the preset function so that the Rank 2 is preset instead of Rank 1 (by gate 33, preset register 34, AND gates 35 and 36 and OR gate 37). Note that the Holding Register 39 is now being located through AND gate 40 with the contents of Rank 1 instead of Rank 2. If the counter is operating normally and PRESET pulses are occurring at the cycle rate of the clock, the contents of Rank 2 immediately prior to the PRESET pulse should be 1 less than the contents of the PRESET Register. The CLOCK PHASE 0 pulse should cause a number 1 greater than the contents of Rank 2 to be loaded into Rank 1. But 1 greater than the contents of Rank 2 is the same as the contents of the Preset Register. Thus a comparator circuit 42 can be connected to the Holding Register and the Preset Register 34 to check each and every bit.

The PRESET REGISTER 34 (FIG. 5) is loaded at some time previous to synchronizing. When no Real Time Pulses are present, the 20 MHz PHI MINUS ONE looks exactly like the 20 MHz PHI signal. That is, no hiccuping is present. Thus on one phase of the clock signal Rank 1 is loaded with a number 1 present than that contained in Rank 2. On the next phase of the clock the contents of Rank 1 are loaded into Rank 2. When a sync pulse is received, a half cycle HC pulse is developed by sync 44 and 45 which replaces one of the half cycles of the 20 MHz PHI MINUS ONE signal so that it looks like a waveform in FIG. 6. If the clock is counting normally (without error) and if a sync pulse is received exactly one overall cycle time of the clock after the last sync pulse and if the contents of the PRESET REGISTER 34 are the same as when the last sync pulse was received, then the contents of the PRESET REGISTER is loaded into Rank 2 and a snapshot is taken of Rank 1 by loading it into the HOLDING REGISTER. Thus the counting of the clock can proceed properly and a comparison made between the contents of the HOLDING REGISTER 39 and the PRESET REGISTER 34 by comparator 42. If these two do not match, an error has occurred, and an error signal will be generated by comparator 42.

Figure 7:
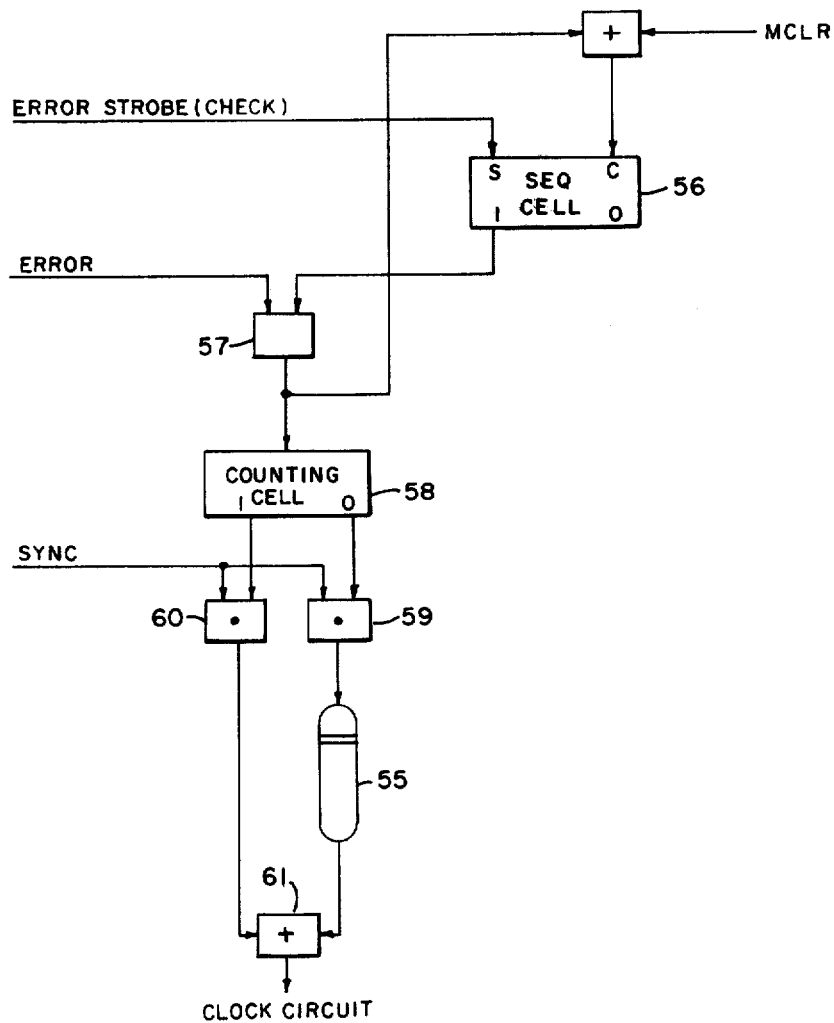
FIG. 7 is a block diagram showing the sync adjuster circuits.

The sync input section of the clocks is shown in FIG. 7. The SYNC ADJUST function is automatically select the sync path to be used. That is, through delay circuit 55 or not. Initially, a Master Clear (MCLR) pulse is developed. This pulse clears the sequential cell 56 so that if an error occurs on the very first HC pulse which occurs after a Master Clear, the state of the SYNC ADJUST circuit cannot be changed. This is necessary because an error state is almost certain to exist upon powdering up and it may have nothing to do with the sync adjust problem. The trailing edge of this first HC pulse sets the sequential cell enabling further HC pulses to change the SYNC ADJUST circuit anytime an error occurs. Since a change of state of the SYNC ADJUST circuit might result in a single error being generated for the very next sync pulse, the sequential cell 56 is once again cleared when the state of the SYNC ADJUST circuit is changed. When an error is present (produced by comparator 42 of FIG. 5), it is fed through AND gate 57 to counting cell 58 to change it to change states. This will enable AND gate 59 and desirable gate 60. Therefore the path of the SYNC will be changed from a direct path to a delayed path to OR gate 61. The output of gate 61 is fed to gates 40 or 36 of FIG. 5.

I claim:

1. In a system having gating circuitry which is to feed information from two different sources each having its own independent timing clocks into a processing device; the improvement comprising sync means connected to the gating circuitry so as to cause both sources to enter processing means at the same time; an additional gate device having an input connected to one of said sources and an output; comparator means having two inputs and an output; one input of said comparator being connected to the output of said additional gate device and the other input being connected to the other one of said sources; said sync means being fed to said additional gate device so as to time the receipt of the information to said comparator in accordance with the sync timing; said comparator producing an error output when its two inputs are not synchronized; and sync correcting means having a control input connected to the output of said comparator.

2. A system as set forth in claim 1 further comprising a first register connected between said additional gate device and said comparator means; and a second register connected between said other one of said sources and said comparator means.

3. A system as set forth in claim 2 wherein said sync correcting means comprises circuit means having a plurality of paths; said output of the comparator being connected to control which path said sync travels; and said paths being of differential electrical lengths with respect to time.

* * * * *